(12) United States Patent
Nakano

(10) Patent No.: US 6,423,989 B1
(45) Date of Patent: Jul. 23, 2002

(54) SEMICONDUCTOR DEVICE AND METHOD OF MANUFACTURING THE SAME

(75) Inventor: Koji Nakano, Kanagawa-ken (JP)

(73) Assignee: Mitsubishi Heavy Industries, Ltd., Tokyo (JP)

(*) Notice: Subject to any disclaimer, the term of this patent is extended or adjusted under 35 U.S.C. 154(b) by 0 days.

(21) Appl. No.: 09/864,248

(22) Filed: May 25, 2001

(30) Foreign Application Priority Data

May 26, 2000 (JP) .................................. 2000-156484

(51) Int. Cl.$^7$ ................ H01L 31/0328; H01L 31/0336
(52) U.S. Cl. ................. 257/192; 257/183; 257/19; 257/197
(58) Field of Search ................... 257/55, 63, 183, 257/194, 165, 19, 197, 192

(56) References Cited

U.S. PATENT DOCUMENTS

| | | | |
|---|---|---|---|
| 5,451,800 A | * | 9/1995 | Mohammad ................ 257/191 |
| 5,523,606 A | * | 6/1996 | Yamazaki ................... 257/370 |
| 5,783,839 A | * | 7/1998 | Morikawa et al. ............ 257/21 |
| 5,834,800 A | * | 11/1998 | Jalali-Farahani et al. ... 257/198 |
| 5,846,867 A | * | 12/1998 | Gomi et al. ................. 438/318 |
| 6,087,683 A | * | 7/2000 | King et al. .................. 257/183 |

* cited by examiner

*Primary Examiner*—Richard Elms
*Assistant Examiner*—Bradley Smith
(74) *Attorney, Agent, or Firm*—Oblon, Spivak, McClelland, Maier & Neustadt, P.C.

(57) ABSTRACT

A semiconductor device comprises an n-conductive type Si substrate, a n-conductive type Si film formed on the n-conductive type Si substrate, a p-conductive type SiGe film formed on the n-conductive type Si film, a p-conductive type Si film formed on the p-conductive type SiGe film, a n-conductive type Si film formed on the p-conductive type Si film, a base electrode formed by removing a part of the n-conductive type Si film or changing the conductive type of a part of the n-conductive type Si film to a p-conductive type, and joining a metal terminal to a part of the p-conductive type Si film exposed by removing the N-type Si film or to the part of the n-conductive type Si film whose conductive type is changed to a p-conductive type, an emitter electrode formed by joining a metal terminal to the n-conductive type Si film, and a collector electrode formed by joining a metal terminal to a back surface of the n-conductive type Si substrate.

5 Claims, 6 Drawing Sheets

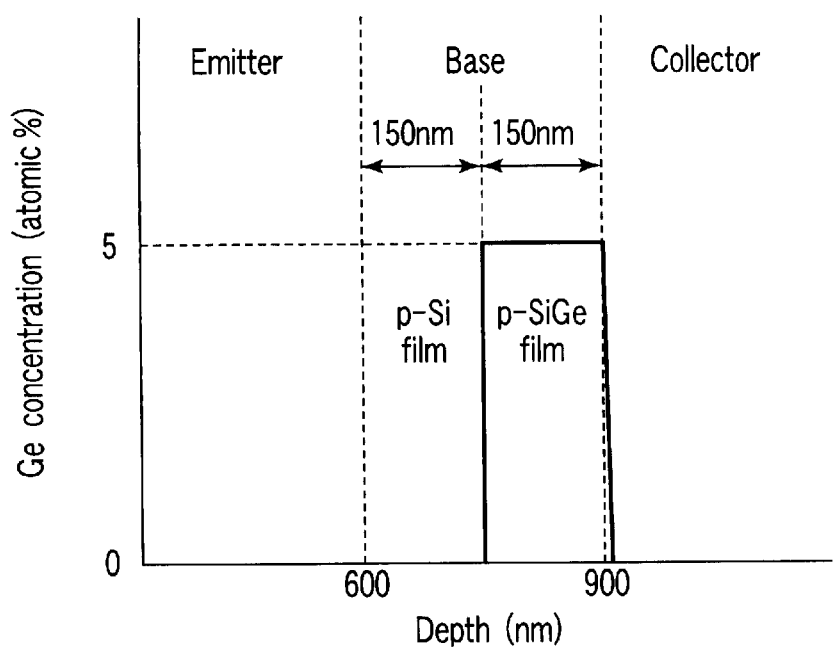
F I G. 5
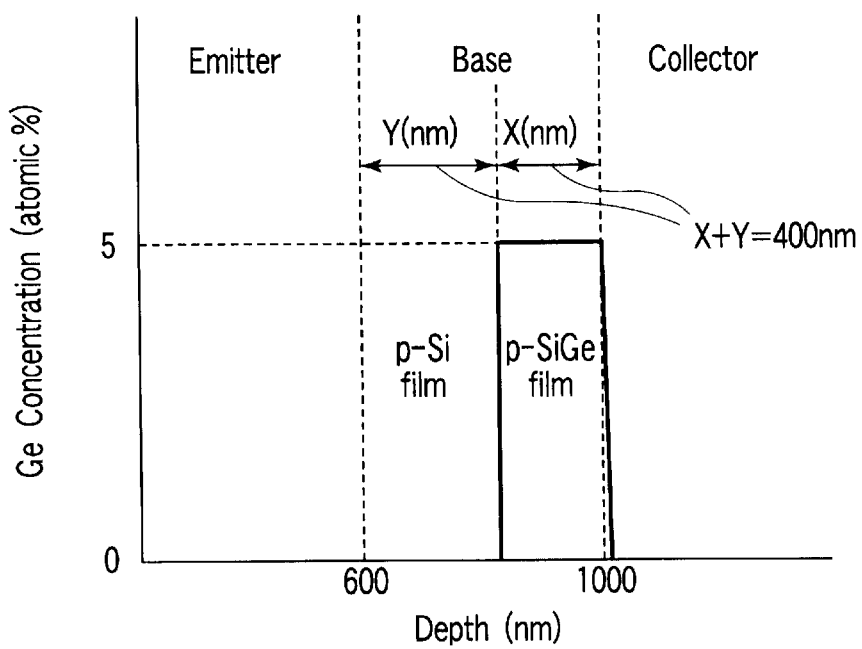
F I G. 6

SEMICONDUCTOR DEVICE AND METHOD OF MANUFACTURING THE SAME

CROSS-REFERENCE TO RELATED APPLICATION

This application is based upon and claims the benefit of priority from the prior Japanese Patent Application No. 2000-156484, filed May 26, 2000, the entire contents of which are incorporated herein by reference.

BACKGROUND OF THE INVENTION

The present invention relates to a semiconductor device such as a transistor and a method of manufacturing the semiconductor device, and more specifically, a SiGe bipolar transistor having a high current gain and a manufacturing method thereof.

An npn-junction conductive type transistor having a high current gain is usually manufactured by the following method. First, a p-conductive type SiGe film 22 and an n-conductive type Si film 23 are sequentially stacked on an n-conductive type Si substrate 21 by chemical vapor deposition (Step S21), as shown in FIGS. 1A, 1B and 2. Then, phosphorous (P) ions supplied from a P ion source 24 are implanted. The resultant structure is subjected to a high-temperature annealing treatment to activate the P ions implanted. As a result, a heavily phosphorus-doped layer 25 is obtained (Step S22). Subsequently, as shown in FIGS. 1C–1E and 2, a part of the heavily phosphorus-doped layer 25 and the n-conductive type Si film 23 are removed by a milling method or reactive ion etching to expose a base surface (Step S23). Thereafter, the resultant structure is subjected to a mesa-etching step to form a mesa etching portion 27 (Step S24). After that, a collector electrode 28, a base electrode 29, and an emitter electrode 30 are independently connected to appropriate portions (Step S25).

In a conventional SiGe transistor, defects easily occur in a p-conductive type SiGe film employed as a base layer. Because of the defects, the lifetime of carriers within the p-conductive type SiGe film tends to be shorter than that of a Si film. Consequently, the switching speed of the SiGe transistor becomes faster than that of a Si transistor. Therefore, the SiGe transistor can serve as a high-speed transistor. However, the p-conductive type SiGe film is low in mobility due to the short lifetime. For this reason, the current gain of the conventional SiGe transistor tends to be lower than that of the Si transistor.

BRIEF SUMMARY OF THE INVENTION

The present invention was attained to overcome the aforementioned problems. An object of the present invention is to provide a semiconductor device such as a SiGe bipolar transistor exhibiting a high current gain and a method of manufacturing the same.

According to the present invention, there is provided a semiconductor device comprising:

a Si substrate of a first conductive type;

a first Si film of the first conductive type formed on the Si substrate;

a SiGe film of a second conductive type formed on the first Si film;

a second Si film of the second conductive type formed on the SiGe film;

a third Si film of the first conductive type formed on the second Si film;

a first electrode formed by removing a part of the third Si film or changing the conductive type of the part of the third Si film of the first conductive type to the second conductive type, and joining a metal terminal to a part of the second Si film exposed by removing the part of the third Si film or a part of the third Si film changed in conductive type;

a second electrode formed by joining a metal terminal to the third Si film; and a third electrode formed by joining a metal terminal to a back surface of the Si substrate.

In the semiconductor device of the present invention, the base is formed of two layers: one is a SiGe film of a second conductive type (p-conductive type) within which the lifetime of carriers tends to be short and their mobility tends to be slow, and the other is a Si film of a second conductive type (p-conductive type) within which the lifetime of carriers is long and their mobility is fast. Due to this, the current gain can be greatly improved. Furthermore, a thickness ratio of the p-conductive type SiGe film and the p-conductive type Si film can be varied in the present invention. It is therefore possible to change the current gain variously. It should be noted that the thickness ratio of both films is not zero. This is because if the thickness ratio is zero, the entire base layer is made of the p-conductive type Si film. This case is not preferable since the switching characteristics deteriorate.

Note that the SiGe film and the second Si film constituting the base are preferably equal in thickness. The total thickness of the SiGe film and the second Si film constituting the base preferably falls within the range of 200–400 nm. The lowermost value of the total thickness of the base is set at 200 nm. This is because if the total thickness of the base is lower than 200 nm, the voltage rating of the transistor is degraded. On the other hand, the uppermost value is set at 400 nm. This is because if the total thickness exceeds 400 nm, the current gain decreases.

The base is not limited to the aforementioned two-layer combination, that is, the p-conductive type SiGe film and p-conductive type Si film. The base may be formed by stacking three or more p-conductive type layers. For example, the three layers base may be formed of the p-conductive type Si film, the p-conductive type SiGe film having X % Ge concentration, and the p-conductive type SiGe film having y % Ge concentration. Alternatively, the base may be a multi-layered structure such as an eleven-layered structure.

Furthermore, it is preferable that the Ge concentration of the p-conductive type SiGe film at a side near an emitter be set at 0% (that is p-conductive type Si film) and increased toward the side near a collector. Incidentally, the upper limit of the Ge concentration of the P-type SiGe film is desirably 20 atomic %. This is because if the Ge concentration is further high, dislocations are formed in the p-conductive type SiGe film. The dislocation decreases the quality of the film and thus degrades transistor characteristics.

According to the present invention, there is provided a method of manufacturing a semiconductor device comprising:

(a) applying a first raw material gas to a surface of a Si substrate of n-conductive type while the substrate is heated in a vacuum chamber to form a first Si film of n-conductive type on the substrate;

(b) applying a second raw material gas to a surface of the first n-conductive type Si film under heating to form a SiGe film of p-conductive type on the first Si film;

(c) applying a third raw material gas to a surface of the SiGe film of p-conductive type under heating to form a second Si film of p-conductive type on the SiGe film;

(d) applying a fourth raw material gas to a surface of the second Si film under heating to form a third Si film of n-conductive type on the second Si film of p-conductive type;

(e) implanting a high concentration of phosphorus ion to a surface layer portion of the third Si film of n-conductive type and annealing the surface layer portion to activate the phosphorus ion implanted;

(f) removing a part of the third Si film due to the second Si film or changing the conductive type of a part of third Si film to another conductive type; and (g) joining a metal terminal to a part of the second Si film exposed by removing the third Si film or the part of the third Si film of another conductive type to form a first electrode, joining a metal terminal to the third Si film to form a second electrode, and joining a metal terminal on a back surface of the Si substrate of n-conductive type to form a third electrode.

When a power transistor having a high current gain is formed as a semiconductor device, it is desirable to employ an n-conductive type Si substrate having a low resistivity as low as 0.1 Ω·cm or less. As a film-formation means, a thermal CVD apparatus using chemical vapor deposition is used.

In the step (a), the first raw material gas contains phosphine of 0.1 ppm or less and the rest being disilane $Si_2H_6$. By using the first raw material gas, it is desirable to form a P-doped n-conductive type Si film of 20–50 µm thick containing P in an amount of $1 \times 10^{15}$ atom/cm$^3$.

In the step (b), the second raw material gas contains 1–25 atomic % of germane $GeH_4$, 1 to $1 \times 10^3$ ppm of boron, and the rest being disilane $Si_2H_6$. By using the second raw material gas, it is desirable to form a B-doped p-conductive type SiGe film of 0–400 nm thick containing B in an amount of $1 \times 10^{16} - 5 \times 10^{17}$ atom/cm$^3$.

In the step (c), the third raw material gas contains 1–1000 ppm of boron and the rest being disilane $Si_2H_6$. By using the third raw material gas, it is desirable to form a B-doped Si film of 0–400 nm thick containing B in an amount of $1 \times 10^{16} - 5 \times 10^{17}$ atom/cm$^3$.

It is desirable that the total thickness of the B-doped p-conductive type SiGe film formed in the step (b) and the B-doped Si film formed in the step (c) should fall within the range of 200–400 nm.

In the step (d), the fourth raw material gas contains phosphine of $1 \times 10^2$ to $1 \times 10^4$ ppm and the rest being disilane $Si_2H_6$. By using the fourth raw material gas, it is desirable to form a P-doped n-conductive type Si film of 100–600 nm thick containing P in an amount of $1 - 8 \times 10^{18}$ atom/cm$^3$.

In the step (e), P is implanted in an amount of $1 \times 10^{14}$ to $1 \times 10^{16}$ atom/cm$^2$ at an acceleration energy of 10–50 kev. The annealing is desirably performed at a temperature from 700 to 1000° C. for 3–60 minutes.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a profile of a Ge concentration distribution in a depth direction of a transistor manufactured by the method of the present invention;

FIG. 6 is a profile of a Ge concentration distribution in a depth direction of a transistor manufactured by the method of the present invention;

DETAILED DESCRIPTION OF THE INVENTION

Hereinafter, various embodiments of the present invention will be explained with reference to the accompanying drawings.

Conditions of each embodiment are as shown in Table 1.

The base of Embodiment 1 is formed of two layers consisting of a p-conductive type SiGe film and a p-conductive type Si film. The two layers have the same thickness. The base of Embodiment 2 is formed of a p-conductive type SiGe film and a p-conductive type Si film as is in Embodiment 1. However, they differ in thickness. The base of Embodiment 3 is formed of eleven-layered p-conductive type SiGe films different in Ge content.

(Embodiment 1)

Embodiment 1 will be explained with reference to FIGS. 3A–3E, 4, and 5. In the SiGe transistor of Embodiment 1, a base was formed of two layers of a p-conductive type SiGe film (film thickness: 150 nm) and a p-conductive type Si film (film thickness: 150 nm).

As a substrate, an $n^+$ type Si substrate 1 of 500 μm thick having a resistivity as low as 0.01 Ω·cm or less was used. On the Si substrate 1, an $n^-$-type Si film 2 was epitaxially grown. The film 2 had a thickness of 20 μm and a resistivity as high as 20 Ω·cm.

Figure 1A:
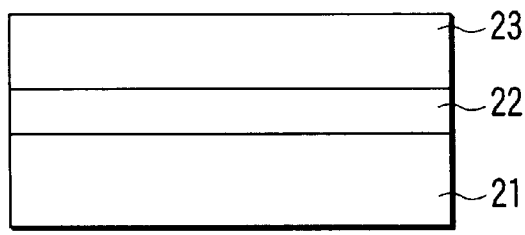
FIGS. 1A–1E show cross-sectional views of stacked structures in the steps of manufacturing a conventional semiconductor device.
Figure 1B:
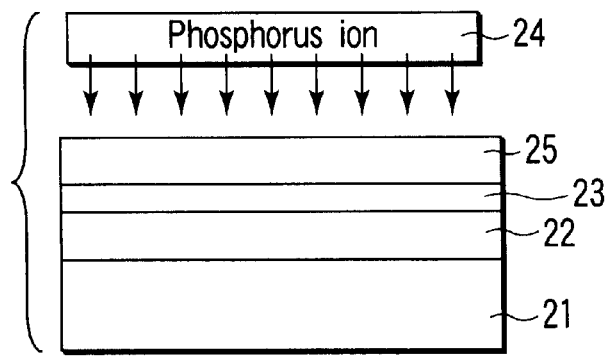
Figure 1C:
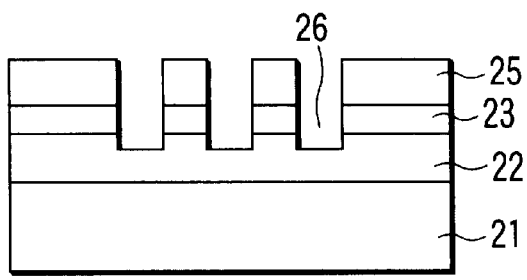
Figure 1D:
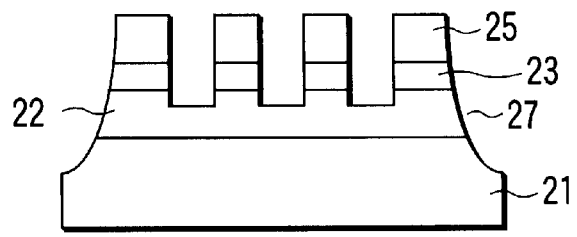
Figure 1E:
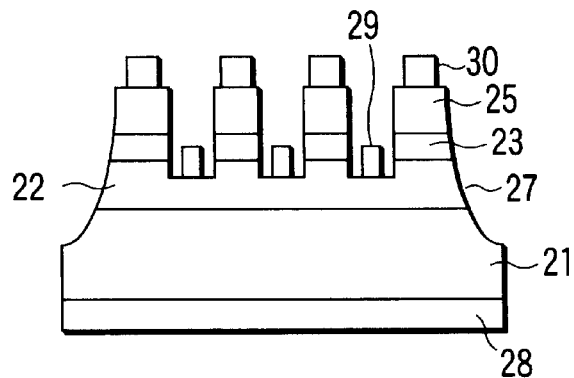
Figures 2, 4:
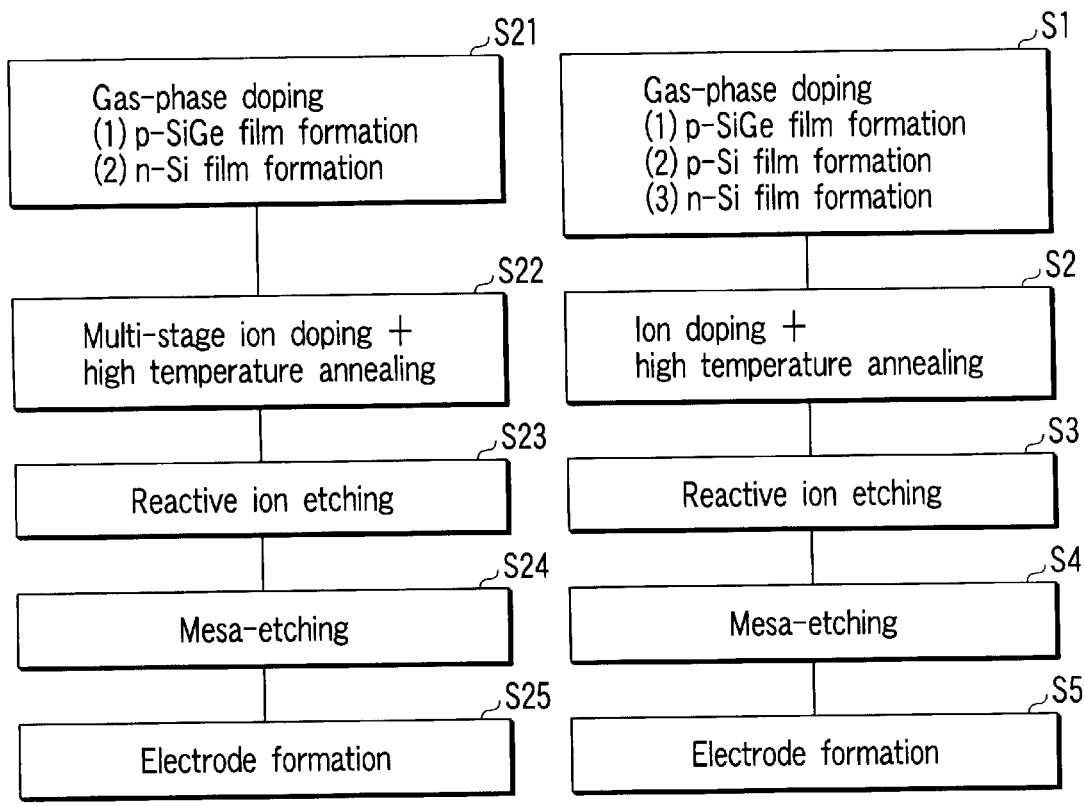
FIG. 2 is a flow-chart showing a conventional manufacturing method.
FIG. 4 is a flow-chart showing a manufacturing method according to Embodiments of the present invention.
Figure 3A:
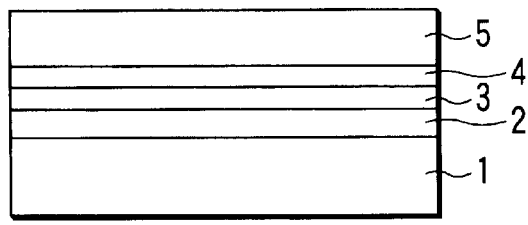
FIGS. 3A–3E show cross-sectional views of stacked structures in the steps of manufacturing a semiconductor device according to an Embodiment of the present invention.

As shown in FIG. 3A, a boron (B)-doped p-conductive type SiGe film 3 of 150 nm thick was formed on the n-Si film 2. Subsequently, a B-doped p-conductive type Si film 4 of 150 nm thick and a P-doped n-conductive type Si film 5 of 600 nm thick were successively formed on the film 3 (Step S1).

As a raw material gas for the p-conductive type SiGe film 3, use was made of a gas mixture consisting of germane (7.5% atomic %), diborane (100 ppm), and the rest being disilane ($4 \times 10^{-4}$ Torr). As a raw material gas for the p-conductive type Si film 4, use was made of a gas mixture consisting of diborane (100 ppm) and the rest being disilane ($4 \times 10^{-4}$ Torr). The supply of the raw material gas for the p-conductive type SiGe film 3 was switched to that of the raw material gas for the p-conductive type Si film 4 by terminating the supply of the germane gas.

As a raw material gas for the n-conductive type Si film 5, use was made of a gas mixture consisting of phosphine (300 ppm) and disilane ($4 \times 10^{-4}$ Torr). The amounts of impurities doped in the films 3, 4, 5 were $1 \times 10^{17}$ atom/cm$^3$, $1 \times 10^{17}$ atom/cm$^3$, and $8 \times 10^{18}$ atom/cm$^3$, respectively.

FIG. 5 is a characteristic graph showing a distribution of a Ge concentration for each of the emitter, base and collector layers of the transistor formed in Embodiment 1. In FIG. 5, the horizontal axis represents a depth (nm) from the surface of the emitter and the vertical axis represents a germanium (Ge) concentration (atomic %). As shown in the figure, the Ge concentration of the p-conductive type SiGe film 3 constituting the base layer was about 5 atomic %. Note that the temperatures of the substrate 1 when layers 3, 4, and 5 were respectively stacked on the substrate 1 were 780° C., 780° C. and 750° C.

Figure 3B:
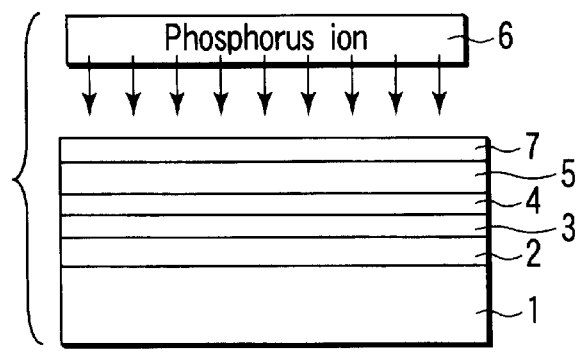

Then, P ions were implanted from a phosphorus ion implanting source 6 into the top surface of the stacked structure thus constructed, that is, the n-conductive type Si film 5, as shown in FIG. 3B. The resultant structure was subjected to an annealing treatment to activate the phosphorus ions implanted. As a result, a heavily phosphorus-doped layer 7 was formed (Step S2). As an example of the phosphorus-ion implanting source 6, use was made of an ion doping apparatus using an excited electron acceleration system. Phosphorus ions of $5 \times 10^{15}$ atom/cm$^2$ were implanted at an acceleration voltage of 30 keV and a temperature of 700° C. for 30 minutes.

Figure 3C:
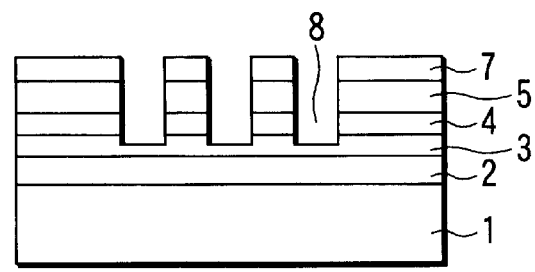
Figure 3D:
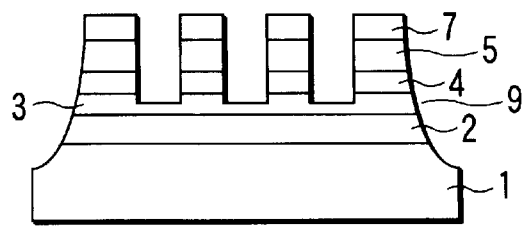
Figure 3E:
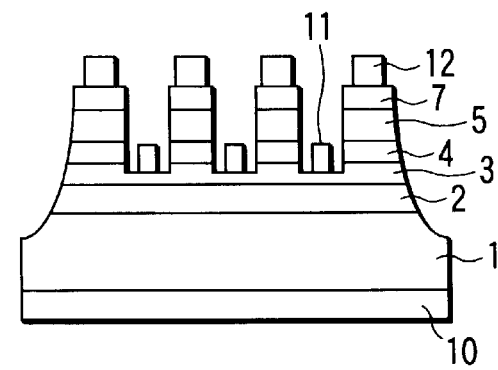

Furthermore, as shown in FIG. 3C, the n-conductive type Si film 5 including the heavily phosphorus-doped layer 7 was selectively etched by reactive ion etching until the p-conductive type Si film 4 was exposed. The exposed surface of the p-conductive type Si film 4 was used as a base surface 8 (Step S3). Subsequently, the resultant structure was subjected to a mesa-etching step. In this step, the peripheral portion of the stacked structure was selectively etched into a mesa form 9, as shown in FIG. 3D (Step S4). Finally, as shown in FIG. 3E, an emitter electrode 12, a base electrode 11, and a collector electrode 10 were individually formed by a metal deposition method (Step S5).

As a result, a power transistor of a 5 mm×5 mm square was obtained. The current gain of the transistor was measured under conditions: $V_{CE}$=2V, $I_c$=20A, it was 107.

In the transistor of Embodiment 1, the base is formed of two layers: one is the p-conductive type SiGe film 3, in which the lifetime of carriers is short and their mobility tends to be slow. The other is the p-conductive type Si film 4, in which the lifetime of carriers is long and their mobility is high. The p-conductive type SiGe film 3 is placed at the side close to the collector. The p-conductive type Si film 4 is placed at the side close to the emitter. With this structure, a transfer efficiency of electrons from the emitter to the collector is improved. As a result, the current gain is greatly enhanced. Conversely, when the p-conductive type SiGe film is placed at the side close to the emitter and the p-conductive type Si film is placed at the side close to the collector, most of electrons disappear by the presence of the p-conductive type SiGe film upon entering into the base from the emitter. As a result, the transfer efficiency of electrons reaching the collector decreases. It is therefore impossible to expect an improvement of a current gain.

(Embodiment 2)

Embodiment 2 will be explained with reference to FIGS. 3A–3E, 2, 5 and 6.

In the transistor of Embodiment 2, while the total thickness of the p-conductive type SiGe film 3 and the p-conductive type Si film 4 was fixed at a predetermined value of 400 nm, the thickness of the p-conductive type SiGe film 3 was varied variously. A substrate was formed by epitaxially growing an n-type Si film 2 on an $n^+$ type Si substrate 1. The $n^+$ type Si substrate 1 had a thickness of 500 μm and a resistivity as low as 0.01 Ω·cm or less. The n-type Si film 2 has a thickness of 20 μm and a resistivity as high as 20 Ω·cm.

As shown in FIG. 3A, on the n-type Si film 2, a B-doped p-conductive type SiGe film 3 of X nm thick, a B-doped p-conductive type Si film 4 of Y nm thick, and a P-doped n-conductive type Si film 5 of 600 nm were successively stacked in this order (Step S1).

FIG. 6 is a characteristic graph showing a distribution of a Ge concentration for each of the emitter, base and collector layers of the transistor formed in Embodiment 2. In FIG. 6, the horizontal axis represents a depth (nm) from the surface of the emitter and the vertical axis represents a germanium (Ge) concentration (atomic %). While the total thickness of X+Y was fixed at a constant value of 400 nm (=X+Y), the film thickness X was changed variously within the range of 1–399 nm. The amounts of impurities doped in the films 3, 4, and 5 were $1 \times 10^{17}$ atom/cm$^3$, $1 \times 10^{17}$ atom/cm$^3$, and $8 \times 10^{18}$ atom/cm$^3$, respectively. The Ge concentration of the p-conductive type SiGe film 3 was set at about 5 atomic %. Note that the temperatures of the substrate 1 when layers 3, 4, and 5 were respectively stacked are 780° C., 780° C. and 750° C.

Then, P-ions were implanted from a phosphorus ion implanting source 6 into the top surface of the stacked structure thus constructed, that is, the n-conductive type Si film 5, as shown in FIG. 3B. The resultant structure was subjected to an annealing treatment to activate the phosphorus ions implanted. As a result, a heavily phosphorus-doped layer 7 was formed (Step S2). Phosphorus ions of $5\times10^{15}$ atom/cm$^2$ were implanted at an acceleration voltage of 30 keV and a temperature of 700° C. for 30 minutes.

Furthermore, as shown in FIG. 3C, the n-conductive type Si film 5 including the heavily phosphorus-doped layer 7 was selectively etched by reactive ion etching until the p-conductive type Si film 4 was exposed. The exposed surface of the p-conductive type Si film 4 was used as a base surface 8 (Step S3). Subsequently, the resultant structure was subjected to a mesa-etching step. In this step, the peripheral portion of the stacked structure was selectively etched into a mesa form 9, as shown in FIG. 3D (Step S4). Finally, as shown in FIG. 3E, an emitter electrode 12, a base electrode 11, and a collector electrode 10 were individually formed by a metal deposition method (Step S5).

As a result, a power transistor of a 5 mm×5 mm square was obtained. The current gain of the power transistor of this embodiment was analyzed with respect to the cases where the thickness of the p-conductive type SiGe film was varied within 1–399 nm. The results are shown in FIG. 7.

Figure 7:
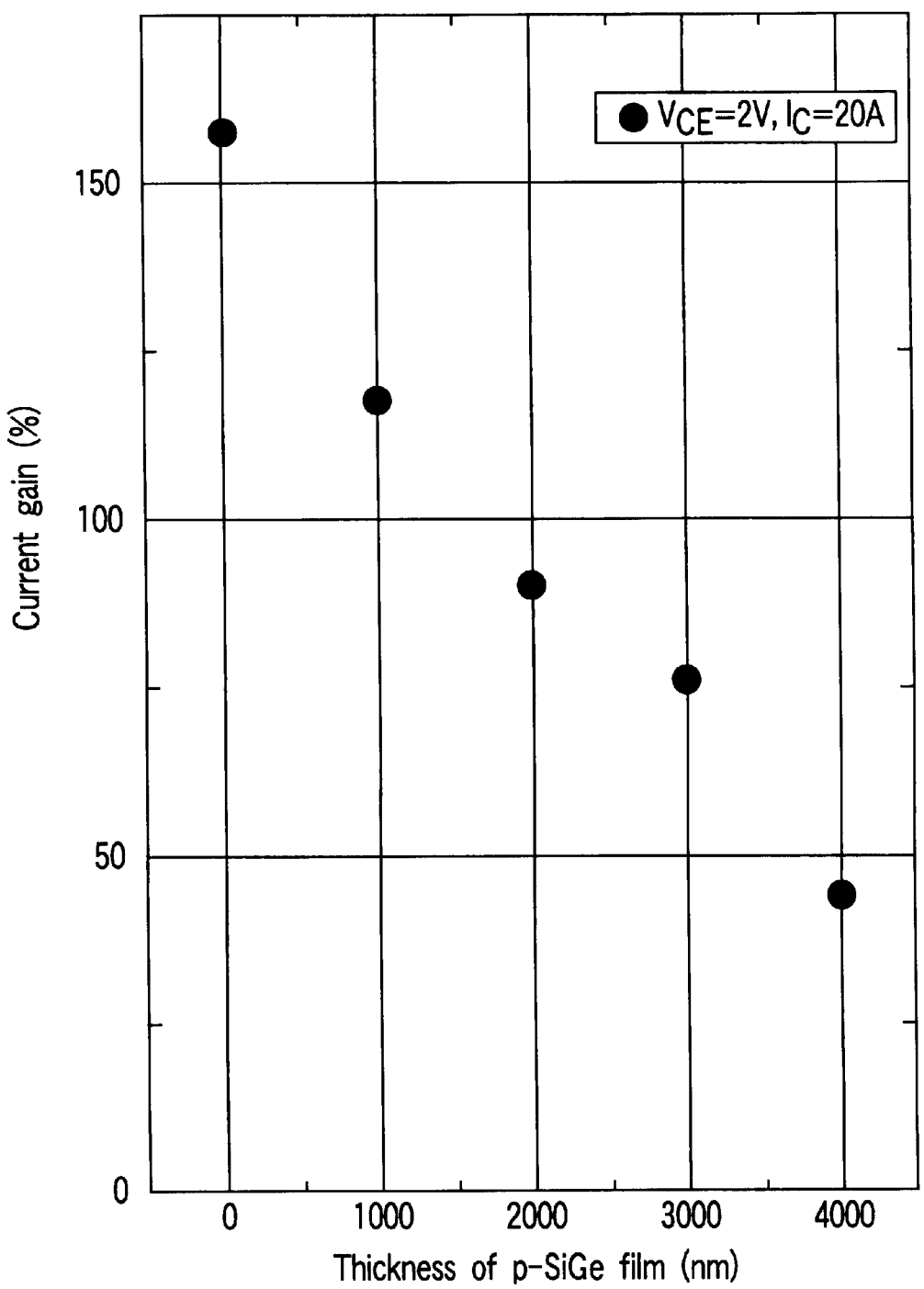
FIG. 7 is a characteristic graph showing the relationship between the film thickness of a p-conductive type SiGe film and the current gain.

FIG. 7 is a characteristic graph showing the current gain versus the thickness of SiGe film. The horizontal axis represents a thickness (nm) of the p-conductive type SiGe film (nm) and the vertical axis represents a current gain. The current gain was obtained under the conditions: $V_{CE}$=2V, $I_c$=20A. As a result, it was found that the thinner the p-conductive type SiGe film, the larger the current gain. It is therefore demonstrated that the base formed of the two-layers is effective. In this embodiment, the base is formed of the p-conductive type SiGe film 3 (the lifetime of carriers is short and thus their mobility tends to be slow) and the p-conductive type Si film 4 (the lifetime of carriers is long and thus their mobility is fast). Further a thickness ratio of the two films 3 and 4 is varied while the total thickness of the films 3 and 4 is maintained constant. It is therefore possible to control the lifetime of carriers within the base. As a result, a SiGe transistor having a higher current gain than that of a conventional one can be attained.

(Embodiment 3)

Figure 8:
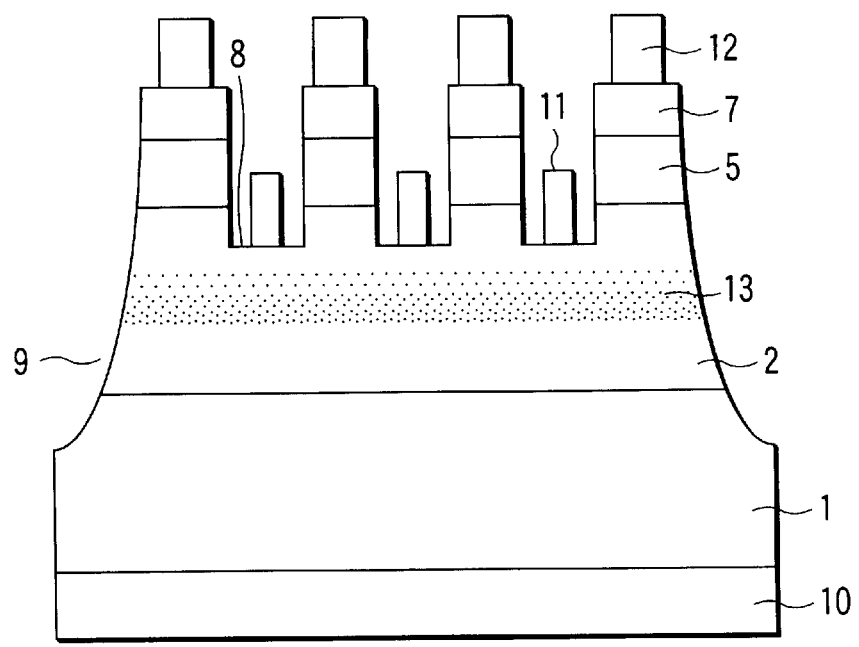
FIG. 8 is a cross-sectional view of a transistor manufactured by a method according to another embodiment of the present invention.

Embodiment 3 will be explained with reference to FIGS. 8 and 9.

A substrate was formed by epitaxially growing an n-type Si film 2 on an n$^+$ type Si substrate 1. The film 1 had a thickness of 500 μm and a resistivity as low as 0.01 Ω·cm or less. The film 2 had a thickness of 20 μm and a resistivity as high as 20 Ω·cm.

On the n-type Si film 2, eleven layers different in Ge content were successively stacked to form a B-doped p-conductive type SiGe film 13. Since the thickness of each of eleven layers of the p-conductive type SiGe film 13 was 30 nm, the total thickness of the film 13 serving as a base resulted in 330 nm. The Ge concentrations X (molar %) of eleven layers of the p-conductive type SiGe film 13 were varied stepwise by 1% within 10–0%. In this case, the Ge concentration of a first layer of the p-conductive type SiGe film 13 was set at 10% and that of the last one was set at 0%. On the p-conductive type SiGe film 13, further a P-doped n-conductive type Si film 5 of 600 nm thick was stacked (Step S1).

Figure 9:
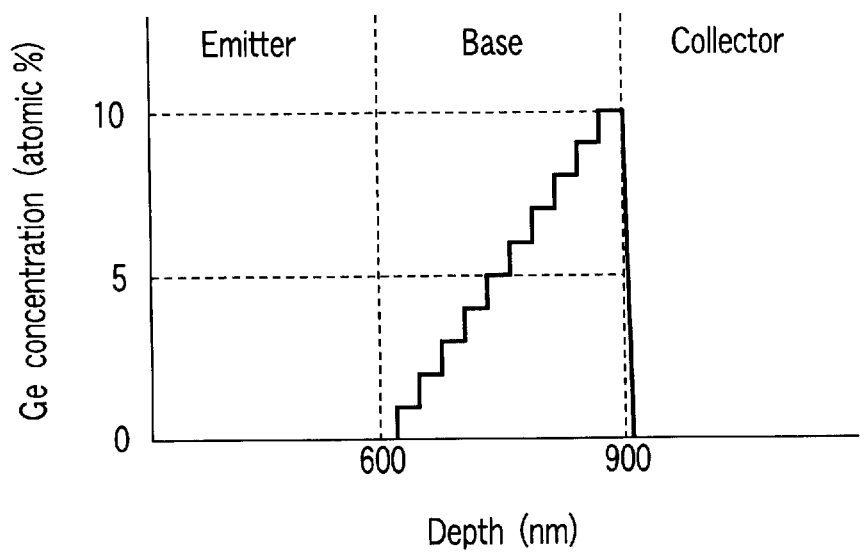
FIG. 9 is a profile of a Ge concentration distribution in a depth direction of a transistor manufactured by the method of the present invention.

FIG. 9 is a characteristic graph showing a distribution of a Ge concentration for each of the emitter, base and collector layers of the transistor formed in Embodiment 3. In FIG. 6, the horizontal axis represents a depth (nm) from the surface of the emitter and the vertical axis represents a germanium (Ge) concentration (atomic %).

As shown in the figure, the Ge concentration of the p-conductive type SiGe film 13 increases stepwise from the emitter toward the collector and reaches a maximum value of 10 atomic % at the first layer from the bottom.

As a raw material gas for the p-conductive type SiGe film 13, use was made of a gas mixture consisting of germane (25–0% atomic %), diborane (100 ppm), and the rest being disilane ($4\times10^{-4}$ Torr). As a raw material gas for the n-conductive type Si film 5, use was made of a gas mixture consisting of phosphine (300 ppm) and disilane ($4\times10^{-4}$ Torr). The amounts of impurities doped in the films 13, 5 were $1\times10^{17}$ atom/cm$^3$ and $8\times10^{18}$ atom/cm$^3$, respectively. The temperatures of the substrate 1 when layers 13 and were respectively formed thereon were 780° C. and 750° C.

Then, P-ions were implanted from a phosphorus ion source 6 into the top surface of the stacked structure thus constructed, that is, a n-conductive type Si film 5. The resultant structure was subjected to an annealing treatment to activate the phosphorus ions implanted. As a result, a heavily phosphorus-doped layer 7 was formed (Step S2). Phosphorus ions of $5\times10^{15}$ atom/cm$^2$ were implanted at an acceleration voltage of 30 keV and at a temperature of 700° C. for 30 minutes.

Furthermore, the p-conductive type Si film 5 was selectively etched by reactive ion etching until the p-conductive type Si film 13 was exposed. The exposed surface of the p-conductive type Si film 13 was used as a base surface 8 (Step S3). Subsequently, the resultant structure was subjected to a mesa-etching step. In this step, the peripheral portion of the stacked structure was selectively etched into a mesa form 9 (Step S4). Furthermore, as shown in FIG. 3E, an emitter electrode 12, a base electrode 11, and a collector electrode 10 were individually formed by a metal deposition method (Step S5).

As a result, a power transistor of a 5 mm×5 mm square was obtained. As the current gain was measured under conditions $V_{CE}$=2V, $I_c$=20A, it was 140.

In the power transistor of Embodiment 3, the base is formed of the p-conductive type SiGe film 13 consisting of eleven layers different in Ge concentration. The Ge concentration of the p-conductive type SiGe film at the side near the emitter is set at almost 0% and increased stepwise toward the side near the collector. As a result, the lifetime of carriers within the base can be controlled.

Furthermore, since the Ge concentration was varied, a gradient of band gaps was formed in the base, generating a drift electric field. Based on both functions, lifetime control and drift electric field, the electron transfer efficiency is improved. As a result, the current gain can be improved.

The constitutions of power transistors according to Embodiments 1–3 are shown in Table 1 below.

TABLE 1

|  | Number of layers of base | Ge concentration (atomic %) | Thickness X of P-type SiGe film and thickness Y of p-conductive type Si film (nm) | thickness of base (nm) |
| --- | --- | --- | --- | --- |
| Embodiment 1 | 2 | 5% | X = 150<br>Y = 150 | 300 |
| 2 | 2 | 5% | X = t<br>Y = 400 − t<br>t; 1–399 | 400 |
| 3 | 11 | 0%, 1%, 2%,<br>3%, 4%, 5%,<br>6%, 7%, 8%,<br>9%, 10% | 30 nm for each layer | 300 |

Note that the layer containing no Ge in Embodiment 3 corresponds to a p-conductive type Si film.

In the embodiments above, a power transistor was explained as an example. However, the present invention is not limited to the aforementioned embodiments and may be applied to other semiconductor devices such as an Insulated Gate Bipolar Transistor (IGBT).

The semiconductor device of the present invention has a high current gain and high-speed switching characteristics. In particular, when a SiGe power transistor was manufactured by using the method of the present invention, it is possible to obtain a transistor having a high current gain and high speed switching characteristics.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A semiconductor device comprising:
a Si substrate of a first conductive type;
a first Si film of the first conductive type formed on the Si substrate;
a SiGe film of a second conductive type formed on the first Si film;
a second Si film of the second conductive type formed on the SiGe film;
a third Si film of the first conductive type formed on the second Si film;
a first electrode formed by removing a part of the third Si film or changing the conductive type of the part of the third Si film of the first conductive type to the second conductive type, and joining a metal terminal to a part of the second Si film exposed by removing the part of the third Si film or a part of the third Si film changed in conductive type;
a second electrode formed by joining a metal terminal to the third Si film; and
a third electrode formed by joining a metal terminal to a back surface of the Si substrate.
2. The semiconductor device according to claim 1, wherein a total film thickness of the SiGe film and the second Si film is set at 200–400 nm.
3. The semiconductor device according to claim 1, wherein the SiGe film is formed of at least two films different in Ge concentration.
4. The semiconductor device according to claim 3, wherein Ge concentration of the SiGe film is higher at a side close to the Si substrate than at a side opposite the Si substrate and stepwise decreases away from the Si substrate and closer to the third Si film.
5. The semiconductor device according to claim 4, wherein the SiGe film has a Ge concentration of 20 atomic % or less.

* * * * *